United States Patent
Campbell et al.

(10) Patent No.: US 8,094,453 B2
(45) Date of Patent: Jan. 10, 2012

(54) COMPLIANT CONDUCTION RAIL ASSEMBLY AND METHOD FACILITATING COOLING OF AN ELECTRONICS STRUCTURE

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 12/570,215

(22) Filed: Sep. 30, 2009

(65) Prior Publication Data

US 2011/0075367 A1 Mar. 31, 2011

(51) Int. Cl.
*H05K 7/20* (2006.01)
(52) U.S. Cl. .................. 361/699; 361/702; 361/715
(58) Field of Classification Search .......... 361/699, 361/702, 715
See application file for complete search history.

(56) References Cited

U.S. PATENT DOCUMENTS

| | | | | |
|---|---|---|---|---|
| 4,298,905 A | * | 11/1981 | Bosler et al. | 361/716 |
| 4,785,379 A | * | 11/1988 | Goodrich | 361/711 |
| 4,884,167 A | * | 11/1989 | Mine | 361/702 |
| 5,052,481 A | | 10/1991 | Horvath et al. | |
| 6,141,211 A | * | 10/2000 | Strickler et al. | 361/679.31 |
| 6,349,035 B1 | * | 2/2002 | Koenen | 361/719 |
| 6,377,453 B1 | | 4/2002 | Belady | |
| 6,393,853 B1 | * | 5/2002 | Vukovic et al. | 62/259.2 |
| 6,853,554 B2 | * | 2/2005 | Bash et al. | 361/699 |
| 6,882,533 B2 | * | 4/2005 | Bash et al. | 361/696 |
| 7,012,807 B2 | | 3/2006 | Chu et al. | |
| 7,023,701 B2 | * | 4/2006 | Stocken et al. | 361/704 |
| 7,675,748 B2 | * | 3/2010 | Matsushima et al. | 361/679.53 |

OTHER PUBLICATIONS

Campbell et al., "Apparatus and Method for Facilitating Immersion-Cooling of an Electronic Subsystem", U.S. Appl. No. 12/256,618, filed Oct. 23, 2008.

Campbell et al., "Liquid-Cooled Cooling Apparatus, Electronics Rack and Methods of Fabrication Thereof", U.S. Appl. No. 12/481,824, filed Jun. 10, 2009.

* cited by examiner

*Primary Examiner* — Gregory Thompson
(74) *Attorney, Agent, or Firm* — Dennis Jung, Esq.; Kevin P. Radigan, Esq.; Heslin Rothenberg Farley & Mesiti P.C.

(57) ABSTRACT

Compliant conduction rail assembly and method are provided for facilitating cooling of an electronics structure. The rail assembly includes a first thermally conductive rail mounted to a surface of the electronics structure, a second thermally conductive rail thermally conductively interfaced to the first rail, and a biasing mechanism biasing the second rail away from the first rail. The first and second rails and the biasing mechanism are configured for slidable insertion into a housing with the electronics structure, the housing containing a liquid-cooled cold plate(s). With insertion of the electronics structure into the housing, the second rail engages the liquid-cooled cold plate and is forced by the biasing mechanism into thermal contact with the cold plate, and is forced by the cold plate towards the first rail, which results in a compliant thermal interface between the electronics structure and the liquid-cooled cold plate of the housing.

20 Claims, 13 Drawing Sheets

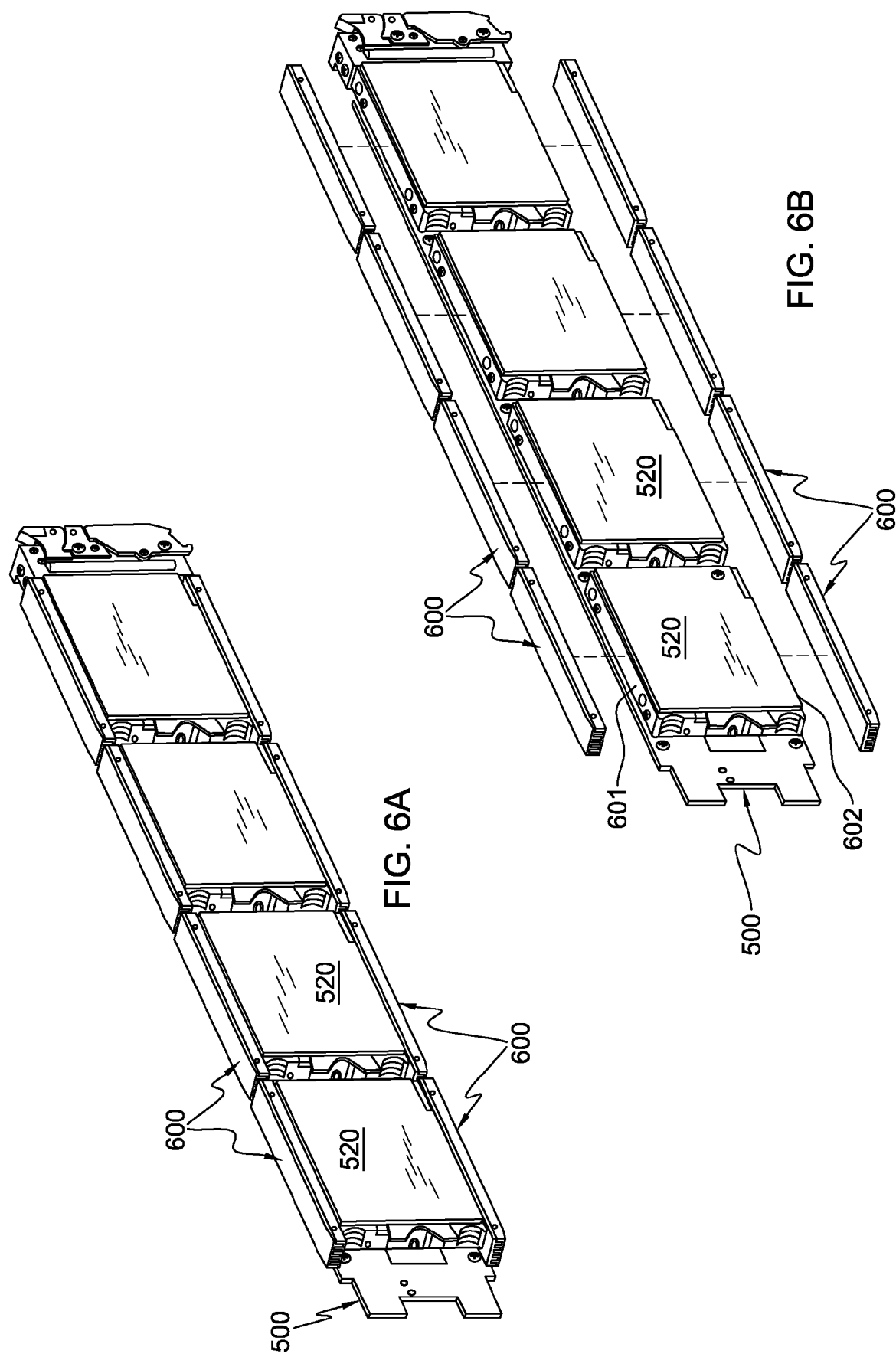

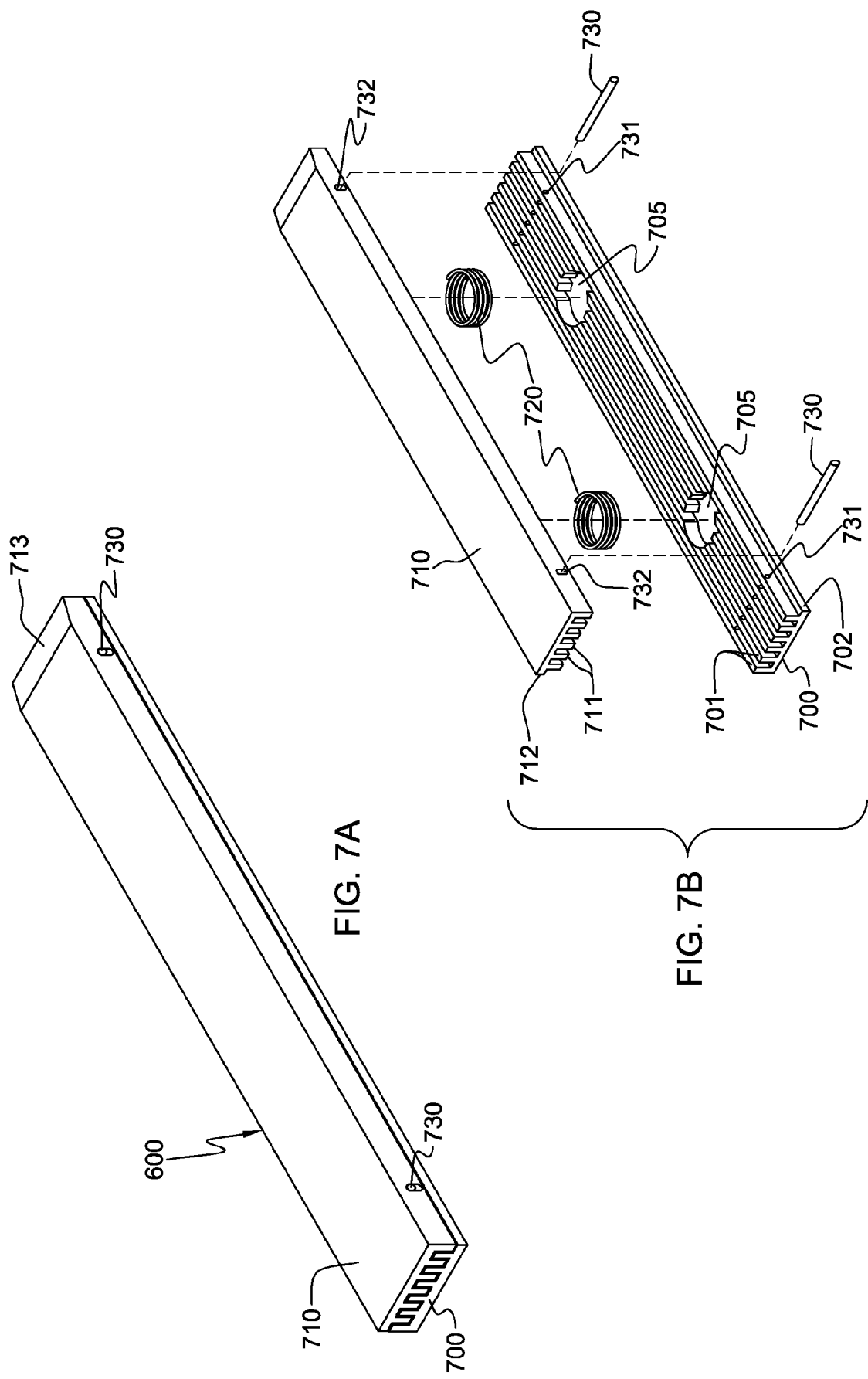

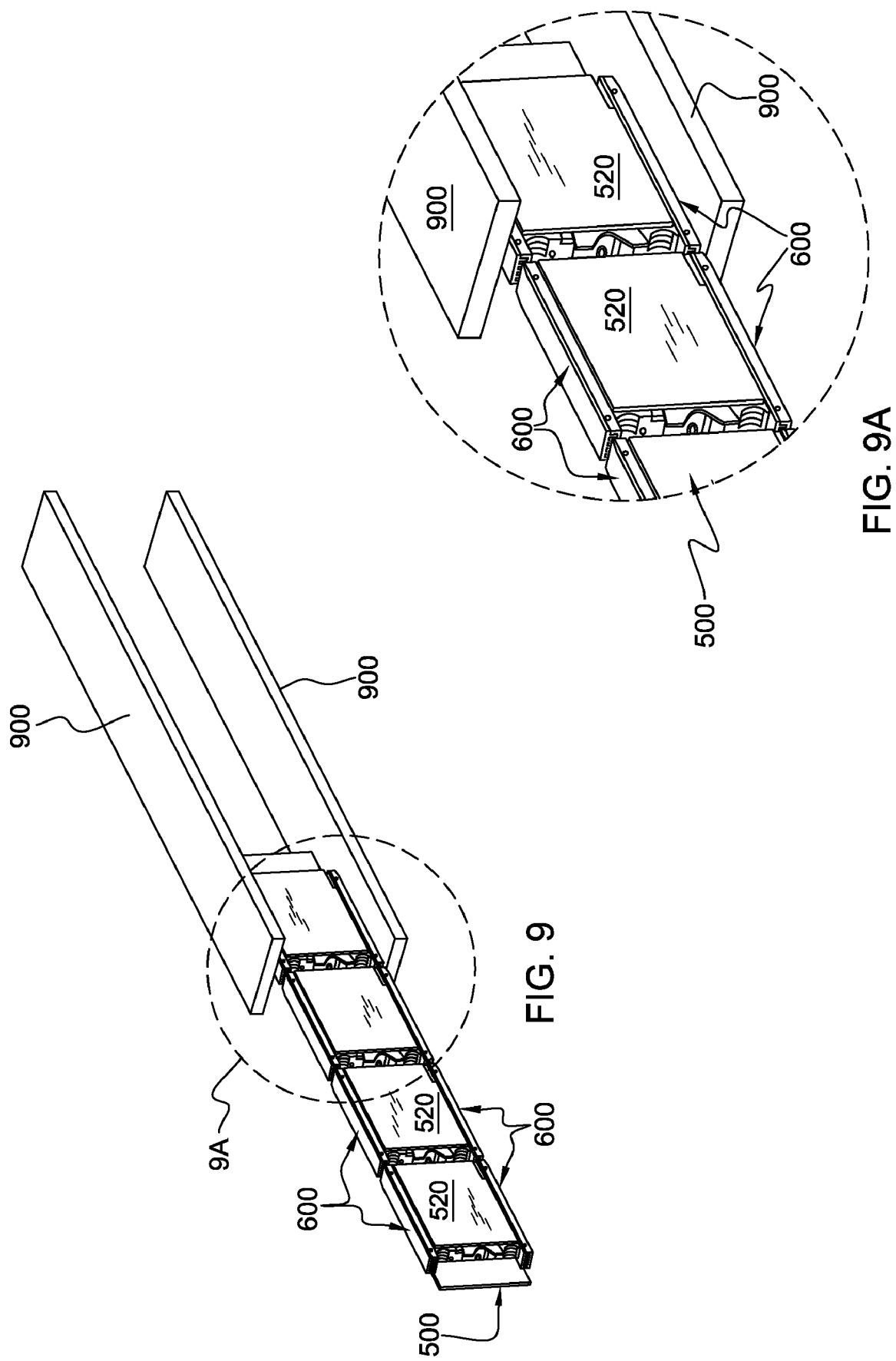

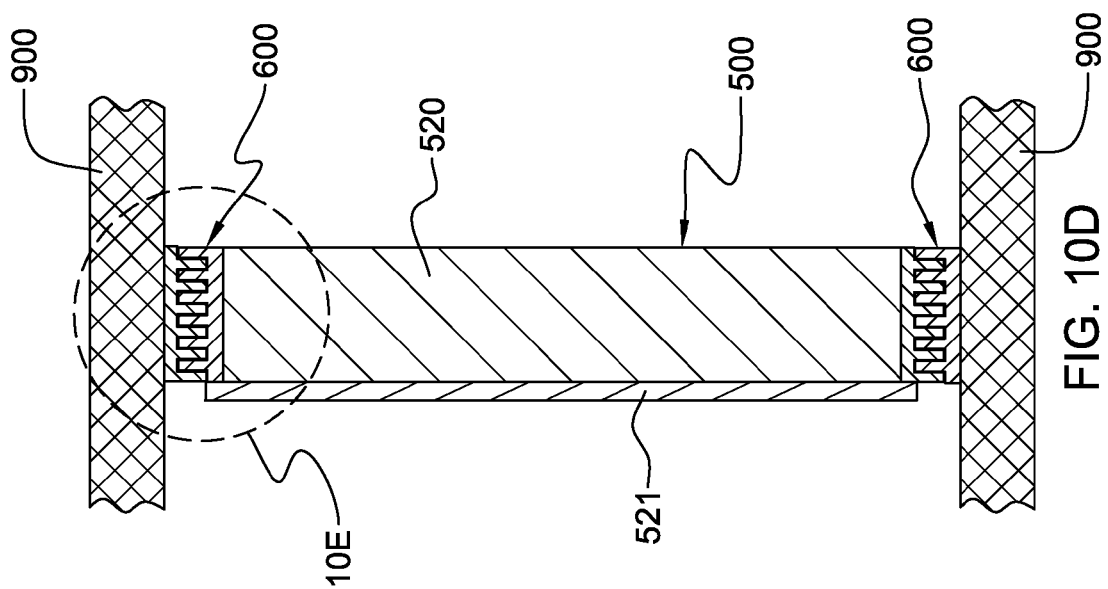
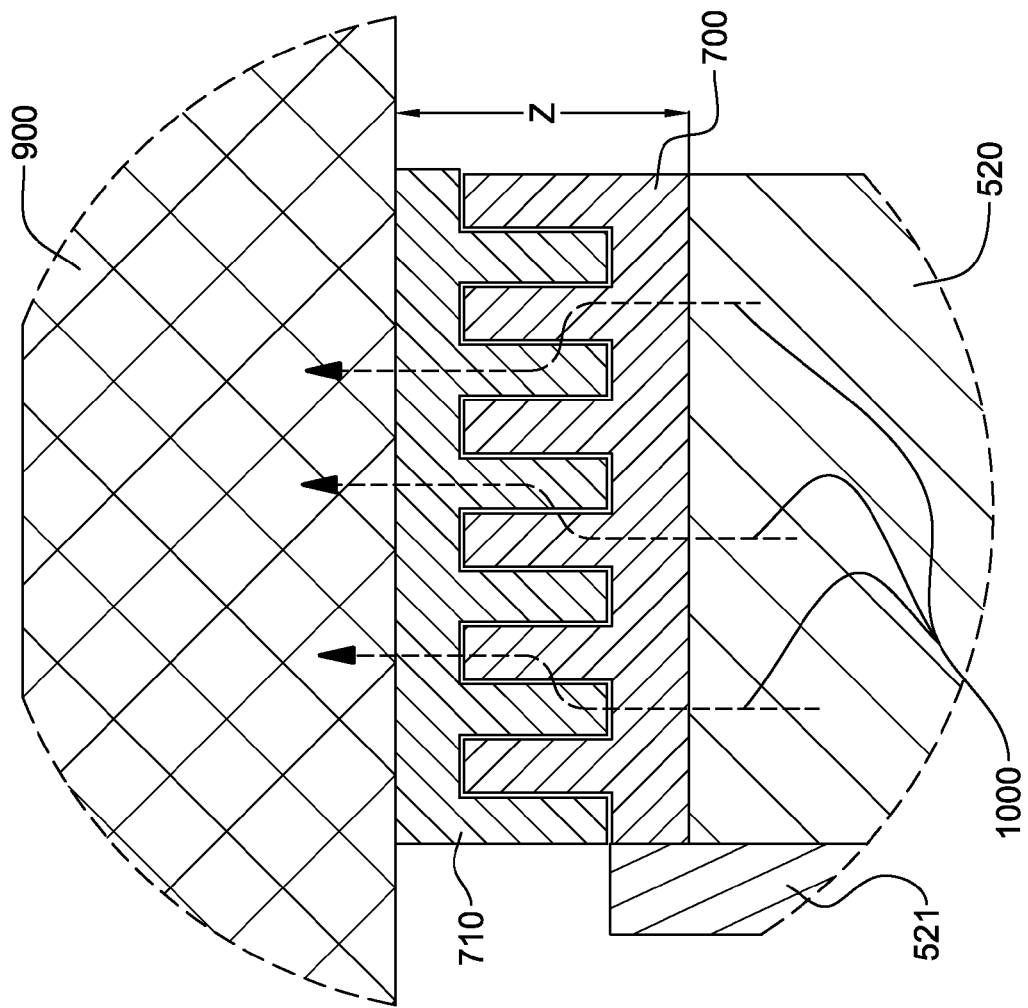
FIG. 10D
FIG. 10E

COMPLIANT CONDUCTION RAIL ASSEMBLY AND METHOD FACILITATING COOLING OF AN ELECTRONICS STRUCTURE

STATEMENT REGARDING FEDERALLY SPONSORED RESEARCH OR DEVELOPMENT

This invention was made with government support under DARPA Contract No. HR0011-07-9-0002, awarded by the Department of Defense. Accordingly, the United States government may have certain rights in the invention.

BACKGROUND

The present invention relates in general to apparatuses and methods for facilitating operation of liquid-cooled assemblages of individual electronics structures.

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, provided herein is a compliant conduction rail assembly for facilitating liquid-based cooling of an electronics structure. The compliant conduction rail assembly includes: a first thermally conductive rail to mount to a surface of the electronics structure; a second thermally conductive rail thermally conductively interfaced to the first thermally conductive rail to allow for heat transfer between the first thermally conductive rail and the second thermally conductive rail; and a biasing mechanism biasing the second thermally conductive rail away from the first thermally conductive rail. The first thermally conductive rail, second thermally conductive rail and biasing mechanism are configured for slidable insertion thereof with the electronics structure into a housing containing a thermal transfer plate, and with insertion of the electronics structure into the housing, the second thermally conductive rail engages the thermal transfer plate and is forced by the biasing mechanism into thermal contact with the thermal transfer plate, and is forced by the thermal transfer plate towards the first thermally conductive rail. The complaint conduction rail assembly thus provides a compliant thermal interface between the electronics structure and the thermal transfer plate within the housing when the electronics structure is docked within the housing.

In another aspect, a liquid-cooled electronics chassis is provided, which includes a housing, containing at least one liquid-cooled cold plate, and a plurality of electronics structures. The electronics structures are configured for operative docking within the housing, and an electronics structure of the plurality of electronics structures includes at least one compliant conduction rail assembly. Each compliant conduction rail assembly includes: a first thermally conductive rail mounted to a surface of the electronics structure; a second thermally conductive rail thermally conductively interfaced to the first thermally conductive rail to allow for heat transfer between the first thermally conductive rail and the second thermally conductive rail; and a biasing mechanism biasing the second thermally conductive rail away from the first thermally conductive rail. With insertion of the electronics structure into the housing, the second thermally conductive rail engages the liquid-cooled cold plate and is forced by the biasing mechanism into thermal contact with the liquid-cooled cold plate, and is forced by the liquid-cooled cold plate towards the first thermally conductive rail. The compliant conductive rail assembly therefore provides a compliant thermal interface between the electronics structure and the liquid-cooled cold plate within the housing.

In a further aspect, a method of facilitating cooling of an electronics structure is provided, wherein the electronics structure is slidably insertable into a housing. The method includes: providing a liquid-cooled cold plate within the housing; mounting a compliant conduction rail assembly to the electronics structure, the compliant conduction rail assembly comprising: a first thermally conductive rail mounted to a surface of the electronics structure; a second thermally conductive rail thermally conductively interfaced to the first thermally conductive rail to allow for heat transfer between the first thermally conductive rail and the second thermally conductive rail; a biasing mechanism biasing the second thermally conductive rail away from the first thermally conductive rail; and wherein the first thermally conductive rail, second thermally conductive rail and biasing mechanism are configured for slidable insertion thereof with the electronics structure into the housing containing the liquid-cooled cold plate; and wherein with insertion of the electronics structure into the housing, the second thermally conductive rail engages the liquid-cooled cold plate and is forced by the biasing mechanism into thermal contact with the liquid-cooled cold plate, and is forced by the liquid-cooled cold plate towards the first thermally conductive rail, and wherein the compliant conduction rail assembly provides a compliant thermal interface between the electronics structure and the liquid-cooled cold plate within the housing.

Additional features and advantages are realized through the techniques of the present invention. Other embodiments and aspects of the invention are described in detail herein and are considered part of a the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 6A is a detailed view of one embodiment of a disk blade to be slidably inserted into the disk enclosure of FIG. 5, and including a plurality of compliant conduction rail assemblies, in accordance with an aspect of the present invention;

FIG. 6B is a partially exploded view of the disk blade and compliant conduction rail assemblies of FIG. 6A, in accordance with an aspect of the present invention;

FIG. 7A depicts one embodiment of a compliant conduction rail assembly, in accordance with an aspect of the present invention;

FIG. 7B is an exploded view of the compliant conduction rail assembly of FIG. 7A, in accordance with an aspect of the present invention;

FIG. 9 illustrates insertion of a disk blade with multiple compliant conduction rail assemblies disposed thereon into a docked position between two opposing thermal transfer plates of a housing (not shown), in accordance with an aspect of the present invention;

FIG. 9A is a partial enlargement of the disk blade and thermal transfer plates of FIG. 9, in accordance with an aspect of the present invention;

FIG. 10D is a transverse cross-sectional view of the electronics structure, compliant conduction rail assemblies, and thermal transfer plates of FIG. 10A, taken along line 10D-10D thereof, in accordance with an aspect of the present invention;

FIG. 10E is a partial enlargement of the electronics structure, compliant conduction rail assemblies, and thermal transfer plates of FIG. 10D, in accordance with an aspect of the present invention;

DETAILED DESCRIPTION

Figure 1:
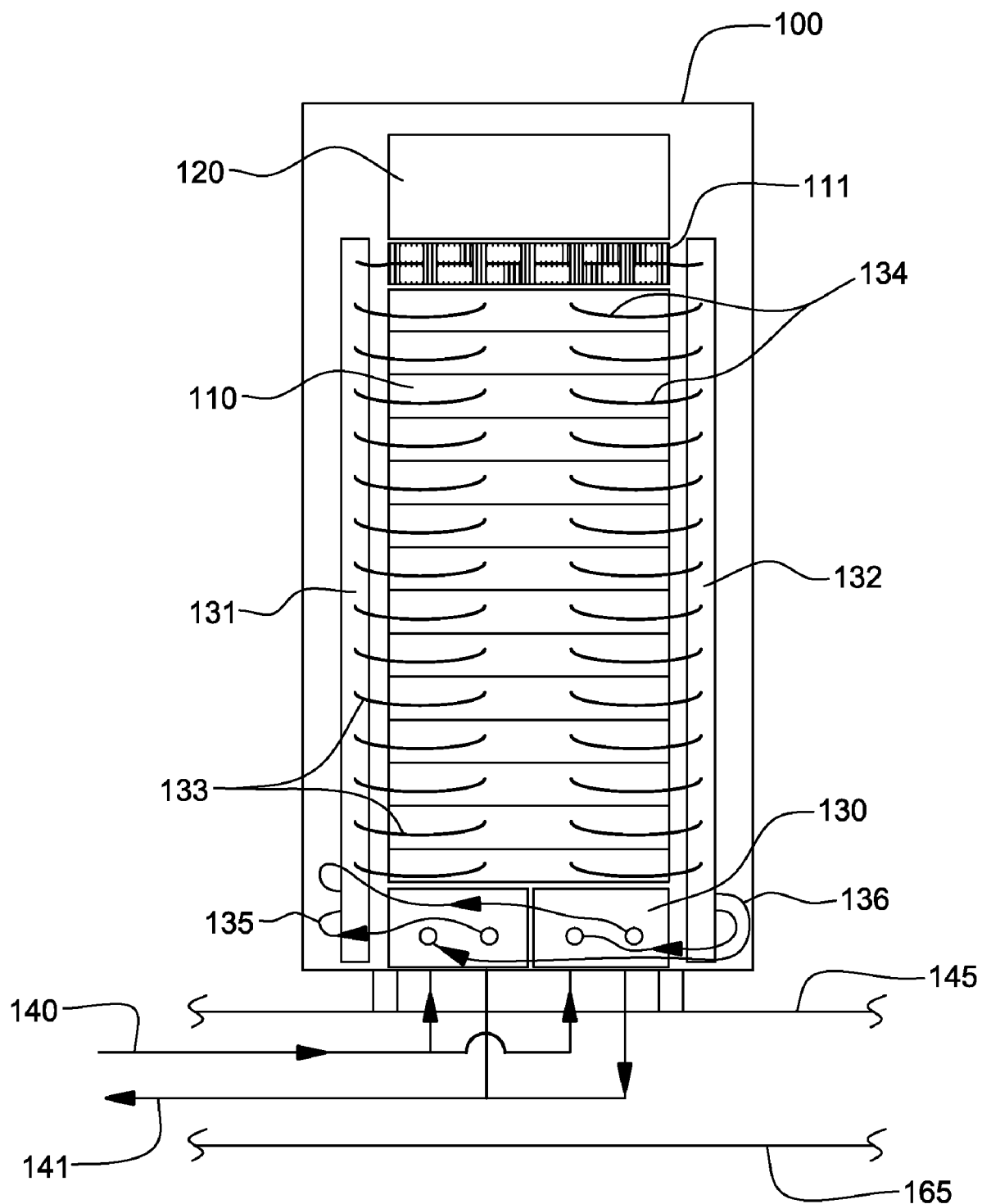
FIG. 1 is a front elevational view of one embodiment of a liquid-cooled electronics rack comprising multiple electronics subsystems (or structures) to be cooled, in part, employing compliant conduction rail assemblies, in accordance with an aspect of the present invention.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics structures, each having one or more heat generating components disposed therein requiring cooling. "Electronics structure" refers to any sub-housing, blade, book, drawer, node, compartment, etc., having one or more heat generating electronic components disposed therein. Each electronics structure of an electronics rack or housing may be movable or fixed relative to the electronics rack or housing, with the rack-mounted electronics drawers of a multi-drawer rack unit and blades of a blade center system being two examples of subsystems of an electronics rack to be cooled.

"Electronic device" refers to any heat generating electronic component of, for example, a computer system or other electronics unit requiring cooling. By way of example, an electronic device may comprise one or more integrated circuit dies and/or other electronic devices to be cooled, including one or more processor dies, memory dies and memory support dies. As a further example, the electronic device may comprise one or more disk drives disposed on a common carrier. Further, unless otherwise specified herein, the term "liquid-cooled cold plate" refers to any thermally conductive structure having a plurality of channels or passageways formed therein for flowing of liquid coolant therethrough. In addition, "metallurgically bonded" refers generally herein to two components being welded, brazed or soldered together by any means.

As used herein, "liquid-to-liquid heat exchanger" may comprise, for example, two or more coolant flow paths, formed of thermally conductive tubings (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

FIG. 1 depicts one embodiment of a liquid-cooled electronics rack 100 which employs a liquid-based cooling system. In one embodiment, liquid-cooled electronics rack 100 comprises a plurality of electronics subsystems or structures 110, which comprise processor or server nodes, as well as a disk enclosure or structure 111 (discussed below with reference to FIG. 5). A bulk power assembly 120 is shown disposed at an upper portion of liquid-cooled electronics rack 100, and two modular cooling units (MCUs) 130 are disposed in a lower portion of the liquid-cooled electronics rack. In the embodiments described herein, the coolant is assumed to be water or an aqueous-based solution, again, by way of example only.

In addition to MCUs 130, the cooling system includes a system water supply manifold 131, a system water return manifold 132, and manifold-to-node fluid connect hoses 133 coupling system water supply manifold 131 to electronics structures 110, 111 and node-to-manifold fluid connect hoses 134 coupling the individual electronics subsystems 110, 111 to system water return manifold 132. Each MCU 130 is in fluid communication with system water supply manifold 131 via a respective system water supply hose 135, and each MCU 130 is in fluid communication with system water return manifold 132 via a respective system water return hose 136.

As illustrated, heat load of the electronics structures is transferred from the system water to cooler facility water supplied by facility water supply line 140 and facility water return line 141 disposed, in the illustrated embodiment, in the space between a raised floor 145 and a base floor 165.

Figure 2:
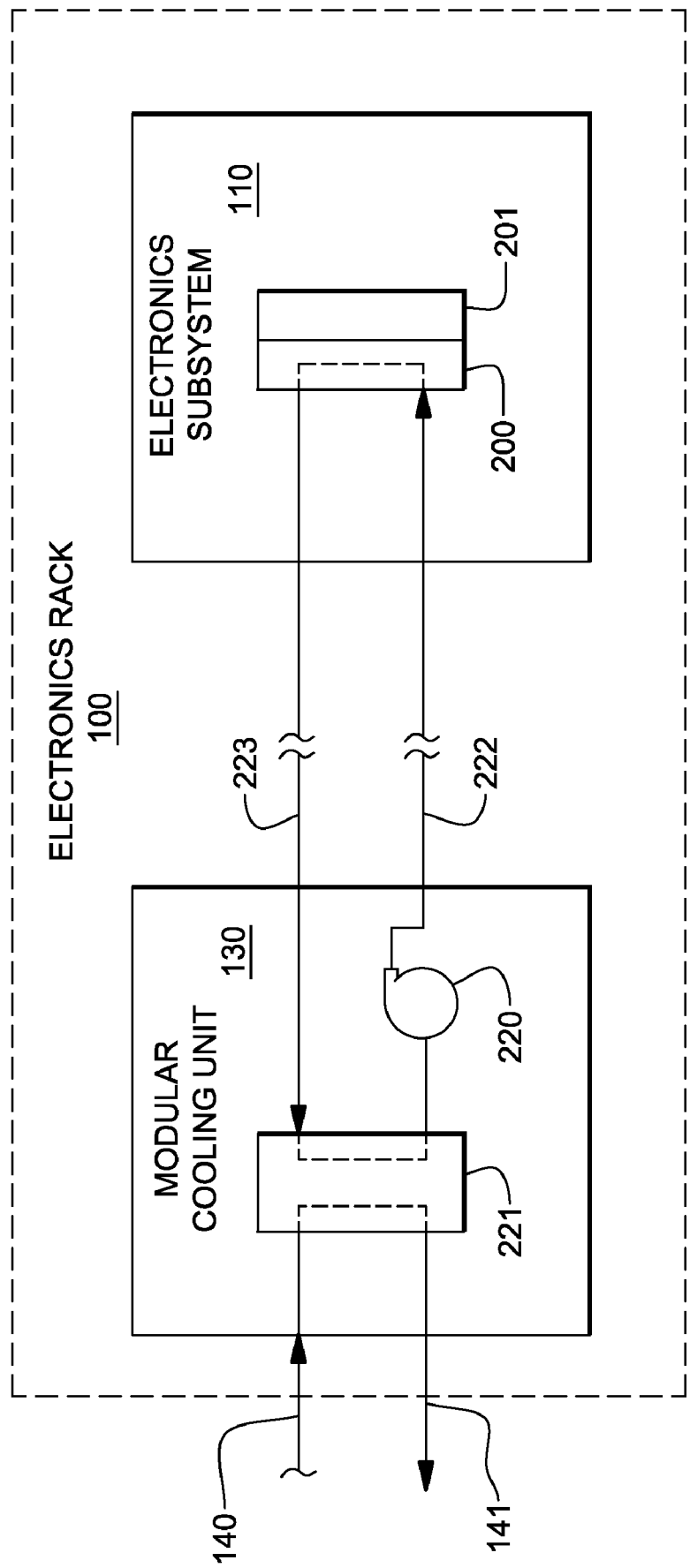
FIG. 2 is a schematic of one embodiment of an electronics subsystem of an electronics rack, wherein an electronics module is liquid-cooled by system coolant provided by one or more modular cooling units disposed within the electronics rack, in accordance with an aspect of the present invention.

FIG. 2 schematically illustrates operation of the cooling system of FIG. 1, wherein a liquid-cooled cold plate 200 is shown coupled to an electronics module 201 of an electronics subsystem 110 within the liquid-cooled electronics rack 100. Heat is removed from electronics module 201 via the system coolant circulated via pump 220 through cold plate 200 within the system coolant loop defined by liquid-to-liquid heat exchanger 221 of modular cooling unit 130, lines 222, 223 and cold plate 200. The system coolant loop and modular cooling unit are designed to provide coolant of a controlled temperature and pressure, as well as controlled chemistry and cleanliness to the electronics module(s). Furthermore, the system coolant is physically separate from the less controlled facility coolant in lines 140, 141, to which heat is ultimately transferred.

Figure 3:
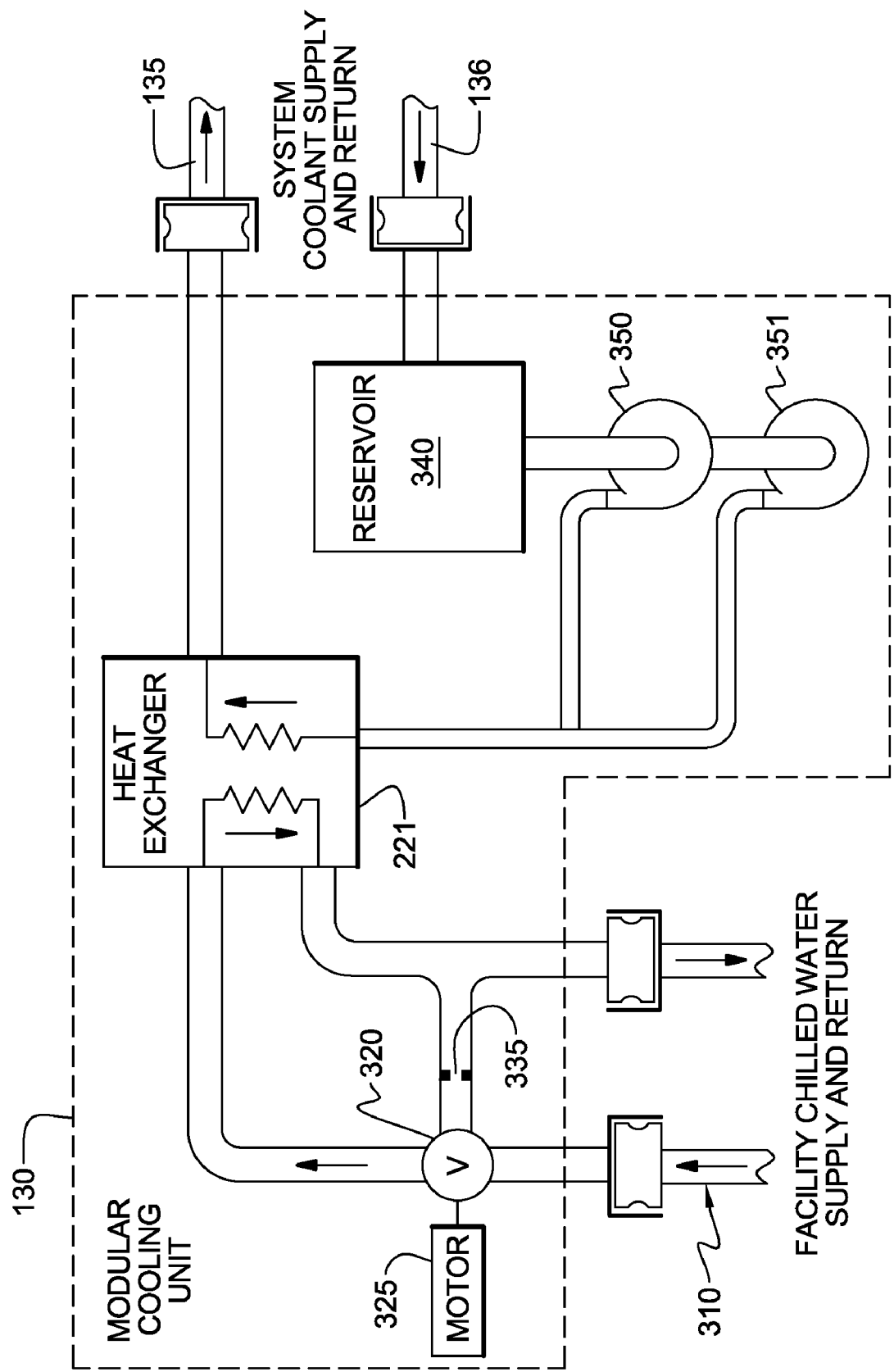
FIG. 3 is a schematic of one embodiment of a modular cooling unit disposed within a liquid-cooled electronics rack, in accordance with an aspect of the present invention.

FIG. 3 depicts a more detailed embodiment of a modular cooling unit 130, in accordance with an aspect of the present invention. As shown in FIG. 3, modular cooling unit 130 includes a facility coolant loop wherein building chilled, facility coolant is supplied 310 and passes through a control valve 320 driven by a motor 325. Valve 320 determines an amount of facility coolant to be passed through liquid-to-liquid heat exchanger 221, with a portion of the facility coolant possibly being returned directly via a bypass orifice 335. The modular cooling unit further includes a system coolant loop with a reservoir tank 340 from which system coolant is pumped, either by pump 350 or pump 351, into the heat exchanger 221 for conditioning and output thereof, as cooled system coolant to the electronics rack to be cooled. The cooled system coolant is supplied to the system supply manifold and system return manifold of the liquid-cooled electronics rack via the system water supply hose 135 and system water return hose 136.

Figure 4:
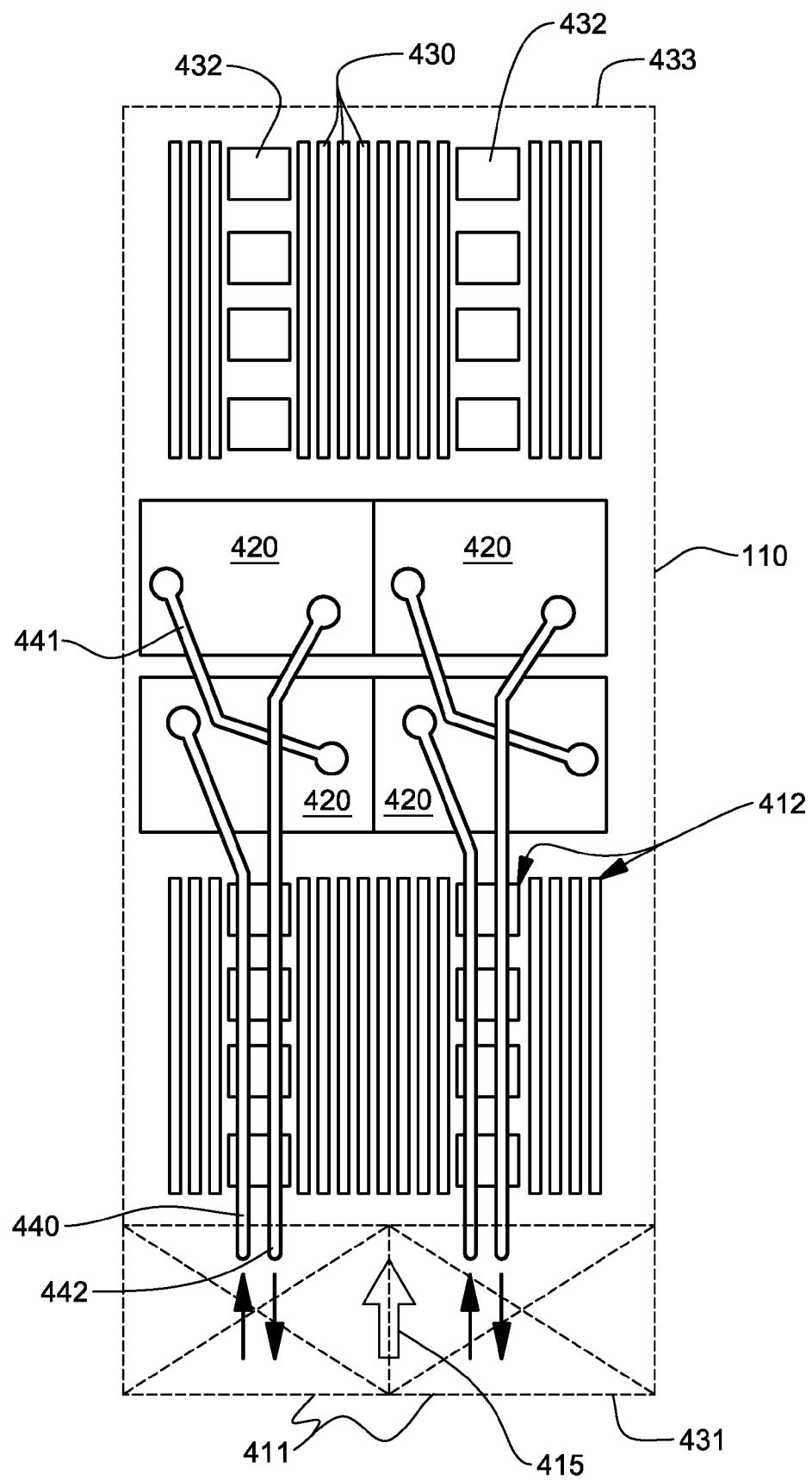
FIG. 4 is a plan view of one embodiment of an electronics subsystem layout illustrating an air and liquid cooling subsystem for cooling components of the electronics subsystem, in accordance with an aspect of the present invention.

FIG. 4 depicts one embodiment of an electronics subsystem 110 layout wherein one or more air moving devices 411 provide forced air flow 415 in normal operating mode to cool multiple devices 412 within electronics subsystem 110. Cool air is taken in through a front 431 and exhausted out a back 433 of the drawer. The multiple devices to be cooled include multiple processor modules to which liquid-cooled cold plates 420 (of a liquid-based cooling system) are coupled, as well as multiple arrays of memory modules 430 (e.g., dual in-line memory modules (DIMMs)) and multiple rows of memory support modules 432 (e.g., DIMM control modules) to which air-cooled heat sinks are coupled. In the embodiment illustrated, memory modules 430 and the memory support modules 432 are partially arrayed near front 431 of electronics subsystem 110, and partially arrayed near back 433 of electronics subsystem 110. Also, in the embodiment of FIG. 4, memory modules 430 and memory support modules 432 are cooled by air flow 415 across the electronics subsystem.

The illustrated liquid-based cooling system further includes multiple coolant-carrying tubes connected to and in fluid communication with liquid-cooled cold plates 420. The coolant-carrying tubes comprise sets of coolant-carrying tubes, with each set including (for example) a coolant supply tube 440, a bridge tube 441 and a coolant return tube 442. In this example, each set of tubes provides liquid coolant to a series-connected pair of cold plates 420 (coupled to a pair of processor modules). Coolant flows into a first cold plate of each pair via the coolant supply tube 440 and from the first cold plate to a second cold plate of the pair via bridge tube or line 441, which may or may not be thermally conductive. From the second cold plate of the pair, coolant is returned through the respective coolant return tube 442.

Figure 5:
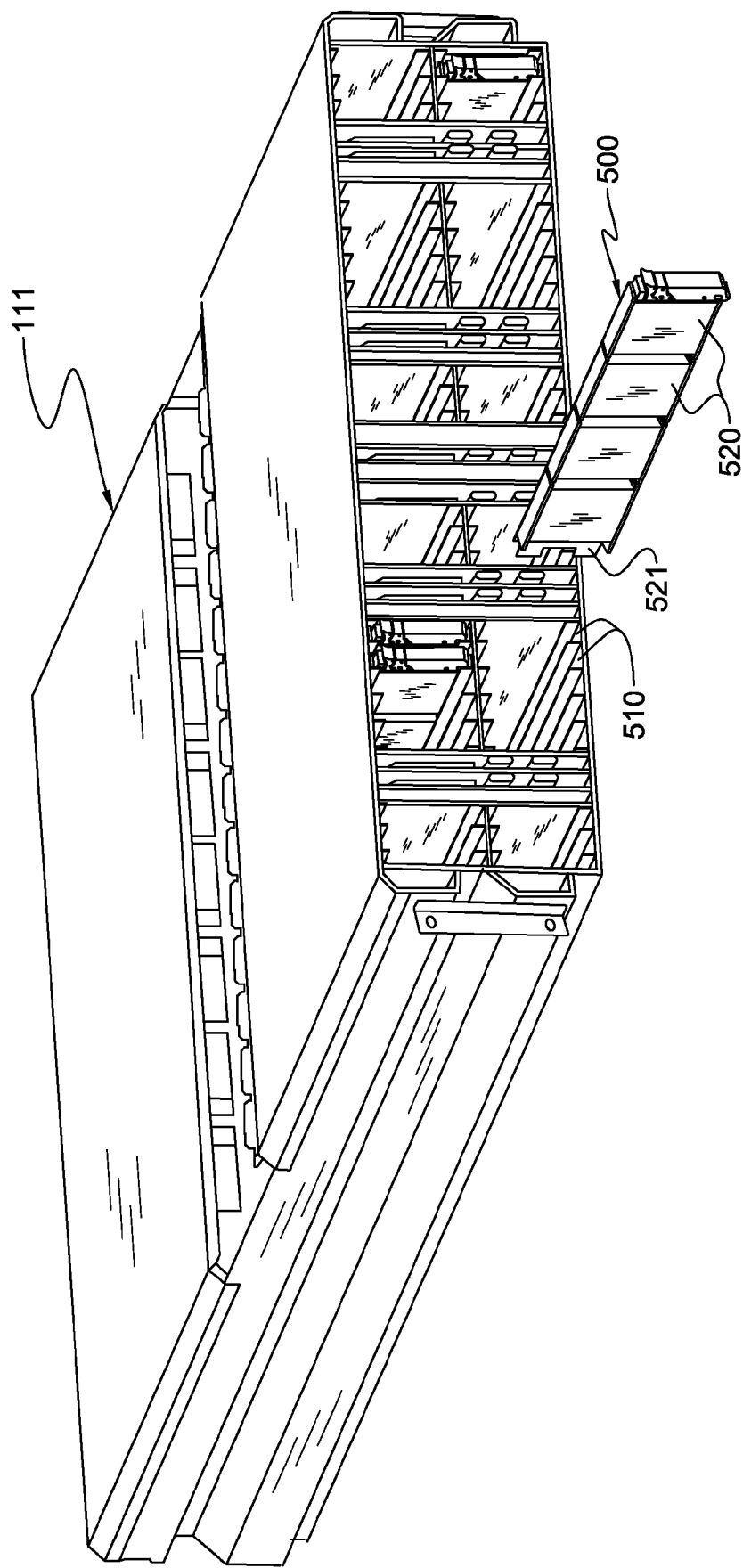
FIG. 5 depicts one embodiment of a disk enclosure for a liquid-cooled electronics rack, wherein the disk enclosure is configured to receive a plurality of disk blades, one or more of which include compliant conduction rail assemblies, in accordance with an aspect of the present invention.

FIG. 5 depicts one embodiment of an electronics subsystem or structure for a housing, such as the above-described electronics rack. In this embodiment, the electronics structure is a disk enclosure 111 which houses a plurality of disk blades 500, that slidably dock in respective docking ports 510 defined within the front and back of disk enclosure 111. Each disk blade 500 includes, in one embodiment, multiple electronic devices 520, such as multiple disk drives, mounted on a common electronics board 521. As one detailed example, disk enclosure 111 houses hundreds of disk drives, packaged four to a disk blade 500. Each blade, when inserted, connects to a backplane (not shown) disposed within the middle of disk enclosure 111 and containing power and communications lines for the blades. This electronics packaging concept is similar to the xSeries® BladeCenter® System offered by International Business Machines Corporation, of Armonk, N.Y. Disk enclosure 111 is analogous to the BladeCenter® chassis, while the disk blade is analogous to the BladeCenter® blade. Like the BladeCenter® chassis, the disk enclosure electronics may be air-cooled. However, function and reliability can be greatly improved by at least partially liquid-cooling the disk drives. The traditional liquid-cooling method of mounting individual cold plates to each electronic device (i.e., each disk drive) would be prohibitive. For example, in such an approach, removing/replacing a disk blade would require that fluid connections be disconnected/connected. Further, given the number and packaging density of electronics blades within the electronics structure, a fluid-connect system to each disk drive would be too costly and occupy too much space.

An alternative liquid-cooling approach is presented herein where liquid-cooled cold plates or rails (or more generally, thermal transfer plates) are fixedly mounted within the electronics structure, for example, above and below the docking ports so that upon docking, the electronics blades make compressive mechanical contact to the liquid-cooled cold plates to ensure good thermal paths from the electronic devices thereof to the liquid-cooled cold plates. In an alternate embodiment, thermal transfer plates are employed within the housing and defining portions of the docking ports. These thermal transfer plates may serve as heat sinks (or spreaders) for conducting heat from the electronics blades to, for example, one or more liquid-cooled cold plates within the housing. When challenged with effectively removing heat in this manner, making a good thermal conductive interface between the electronics blade(s) and the thermal transfer plate(s) once the blade is inserted into the housing is important. Disclosed hereinbelow is a compliant conduction rail assembly and method which ensures good thermal connection between, generally, the electronics structure and the thermal transfer plate(s) or liquid-cooled cold plate(s) when the electronics structure is inserted within the housing.

Those skilled in the art will note from the following discussion that the concepts disclosed herein apply to any packaging situation where good thermal contact is desired to be made between a first packaging level (e.g., an electronics blade) and a thermal transfer plate or liquid-cooled cold plate residing in a next higher level of packaging. For example, the concepts disclosed herein apply to an electronics blade being inserted within a disk enclosure, or to an electronics subsystem or structure being inserted within an electronics rack, etc. The electronics blade and disk enclosure depicted in FIG. 5 are discussed hereinbelow as one example only of an implementation using the disclosed compliant conduction rail assembly.

FIGS. 6A & 6B depict one embodiment of a compliant conduction rail assembly, generally denoted 600, in accordance with an aspect of the present invention. In these figures, a plurality of compliant conduction rail assemblies are shown mounted to respective electronic devices 520 of electronics blade 500. In particular, each electronics device 520 has compliant conduction rail assemblies 600 mounted to two opposing edges, that is, an upper edge 601 and a lower edge 602. The compliant conduction rail assemblies are constructed, as described above, to provide a good thermal interface between the respective electronic device and the thermal transfer plate (or liquid-cooled cold plate) mounted within the housing and positioned, for example, to define a portion of the docking port within which the electronics blade is to be inserted. Note that as an alternative embodiment, instead of individual compliant conduction rail assemblies 600 mounted to the upper and lower edges 601, 602 of each electronic device 520, a single compliant conduction rail assembly could be disposed along a top edge of the electronics blade and a single compliant conduction rail assembly could be disposed along a bottom edge of the electronics blade to extend across multiple electronic devices. Provision of individual compliant conduction rail assemblies, however, advantageously allows for a better thermal interface to be formed between each electronic device and the respective thermal transfer plates disposed within the housing. The additional rail assemblies better accommodate any dimensional mismatch between the electronic devices on the supporting electronics card and the thermal transfer plates within the housing.

FIGS. 7A & 7B depict in detail one embodiment of a compliant conduction rail assembly 600, in accordance with an aspect of the present invention. As illustrated, compliant conduction rail assembly 600 includes a first thermally conductive rail 700 and a second thermally conductive rail 710, which in the example of FIGS. 6A & 6B, are respectively an upper thermally conductive rail and a lower thermally conductive rail. Note, however, that the thermally conductive rails disclosed herein could alternatively be disposed on vertically-extending surfaces of an electronics structure being inserted into a higher-level package, and thus may not necessarily be upper and lower rails.

First thermally conductive rail 700 is configured to mount to a surface of the electronics structure (e.g., the electronics blade or electronic device) to be cooled. Second thermally conductive rail assembly 710 is thermally conductively interfaced to the first thermally conductive rail assembly to allow for heat transfer between the first thermally conductive rail and the second thermally conductive rail. A biasing mechanism, such as springs 720, is disposed (in this example) between first thermally conductive rail 700 and second thermally conductive rail 710, for example, within respective spring-receiving pockets 705 in first thermally conductive rail 700 and second thermally conductive rail 710. Pockets 705 can be machined into both rails to accept the coil springs. The biasing mechanism biases second thermally conductive rail 710 away from first thermally conductive rail 700 (to provide a compressive loading to the thermal transfer plate).

As shown, the first thermally conductive rail 700 comprises a plurality of thermally conductive fins 701 (e.g., rectangular plate fins) extending from a thermally conductive base 702, and the second thermally conductive rail 710 comprises a plurality of thermally conductive fins 711 (e.g., rectangular plate fins) extending from a thermally conductive base 712. The plurality of thermally conductive fins 701 of first thermally conductive rail 700 and the plurality of thermally conductive fins 711 of second thermally conductive rail 710 are sized and positioned to interdigitate in the assembled compliant conduction rail assembly 600, as shown in FIG. 7A. The assembly is held together via retention pins 730 disposed within aligned openings 731, 732 in the pluralities of thermally conductive fins of the first thermally conductive rail and second thermally conductive rail. Upon assembly, the upper and lower rails are brought together such that the plurality of thermally conductive fins of the upper rail fit in between the plurality of thermally conductive fins of the lower rail. Once assembled with the springs in place, the retention pins are inserted as shown to prevent the second thermally conductive rail from pulling completely away from the first thermally conductive rail. The result is a compliant interface assembly wherein a defined amount of travel is provided to accommodate the mechanical tolerances associated with the electronics structure and the housing.

As noted above, in one detailed embodiment, each electronics device 520 is a hard disk drive, and a compliant conduction rail assembly is provided for the upper and lower edges of each disk drive. In the example depicted in FIGS. 7A & 7B, a chamfered edge 713 is provided in the leading edge of the complaint conduction rail assembly, that is, in a direction of insertion of the electronics blade into the housing.

Figure 8A:
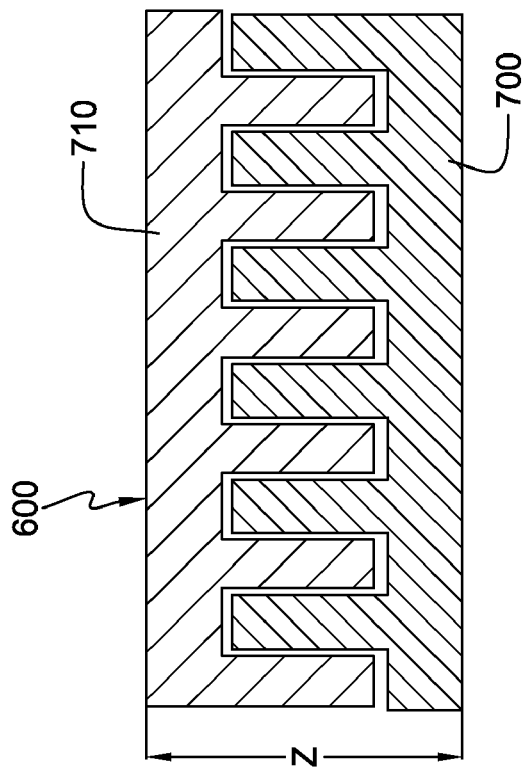
FIG. 8A is a transverse cross-sectional view of the compliant conduction rail assembly of FIG. 7A, illustrating an undocked height of the compliant conductive rail assembly, i.e., a height of the assembly when the associated disk blade (not shown) is undocked from the disk enclosure, in accordance with an aspect of the present invention.
Figure 8B:
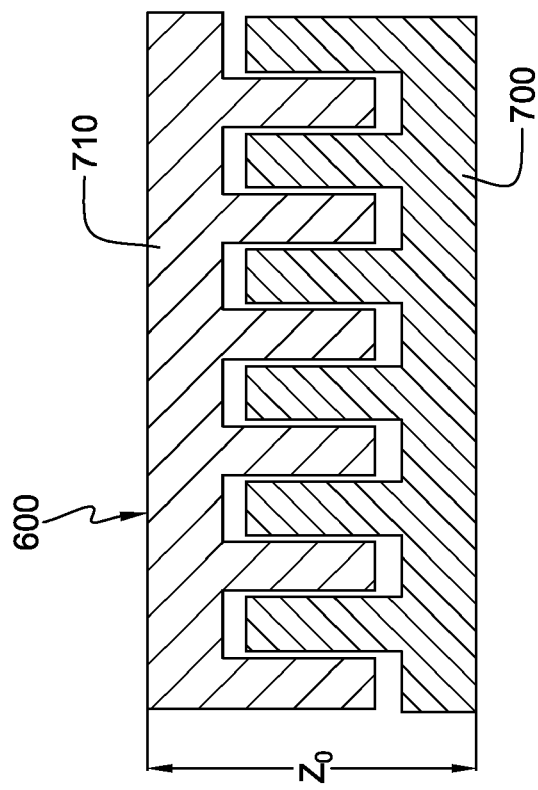
FIG. 8B is a cross-sectional elevational view of the compliant conduction rail assembly of FIGS. 7A & 8A, illustrating a docked height of the compliant conduction rail assembly, i.e., a height of the assembly when the associated disk blade (not shown) is docked within the disk enclosure, in accordance with an aspect of the present invention.

FIGS. 8A & 8B illustrate transverse cross-sectional views of the compliant conduction rail assembly 600 discussed above. FIG. 8A depicts a cross-sectional view of compliant conduction rail assembly 600 when the respective electronics blade is undocked from the housing. In this case, the biasing mechanism (not shown) separates second thermally conductive rail 710 from first thermally conductive rail 700 such that the distance from a lower surface of the rail assembly to the upper surface of the rail assembly is a prescribed distance $Z_o$. By way of specific example, in the electronics blade configuration described above, when the electronics blade is undocked from the housing, the distance between the upper and lower surfaces of the upper and lower rail assemblies is greater than the vertical distance between the opposing thermal transfer plates (or liquid-cooled cold plates) within the housing defining, in part, the docking port to which the electronics blade is to be inserted. When the blade is inserted into the enclosure, the second thermally conductive rails 710 are forced into contact with the respective thermal transfer plate, and forced by the respective thermal transfer plate closer to the first thermally conductive rails, thereby increasing the overlapping surface area between the first and second rails. The result is a compressive loading of the second thermally conductive rails to the thermal transfer plates, with the physical separation between the upper and lower surfaces of the rail assemblies being represented by height Z, as shown by the depiction of FIG. 8B, which assumes that the electronics blade is docked within the housing. Note that $Z<Z_o$.

FIGS. 9 & 9A illustrate partial insertion of electronics blade 500 between two thermal transfer plates 900. As shown, electronics blade 500 includes multiple electronic devices 520 (such as disk drives) mounted to a disk board, and has a plurality of compliant conduction rail assemblies 600 mounted to upper and lower edges of the electronic devices 520. In one embodiment, each thermal transfer plate 900 is a liquid-cooled cold plate mounted within a housing, such as an electronics enclosure or a rack within which the electronics blade is being inserted (i.e., docked). In the detail of FIG. 9A, one electronic device 520 of electronic blade 500 is shown inserted between thermal transfer plates 900, such that the second thermally conductive rails on the upper and lower edges thereof are thermally interfaced to the thermal transfer plates 900, and pushed towards the first thermally conductive rails. This is shown in greater detail in FIGS. 10A-10E.

Figure 10A:
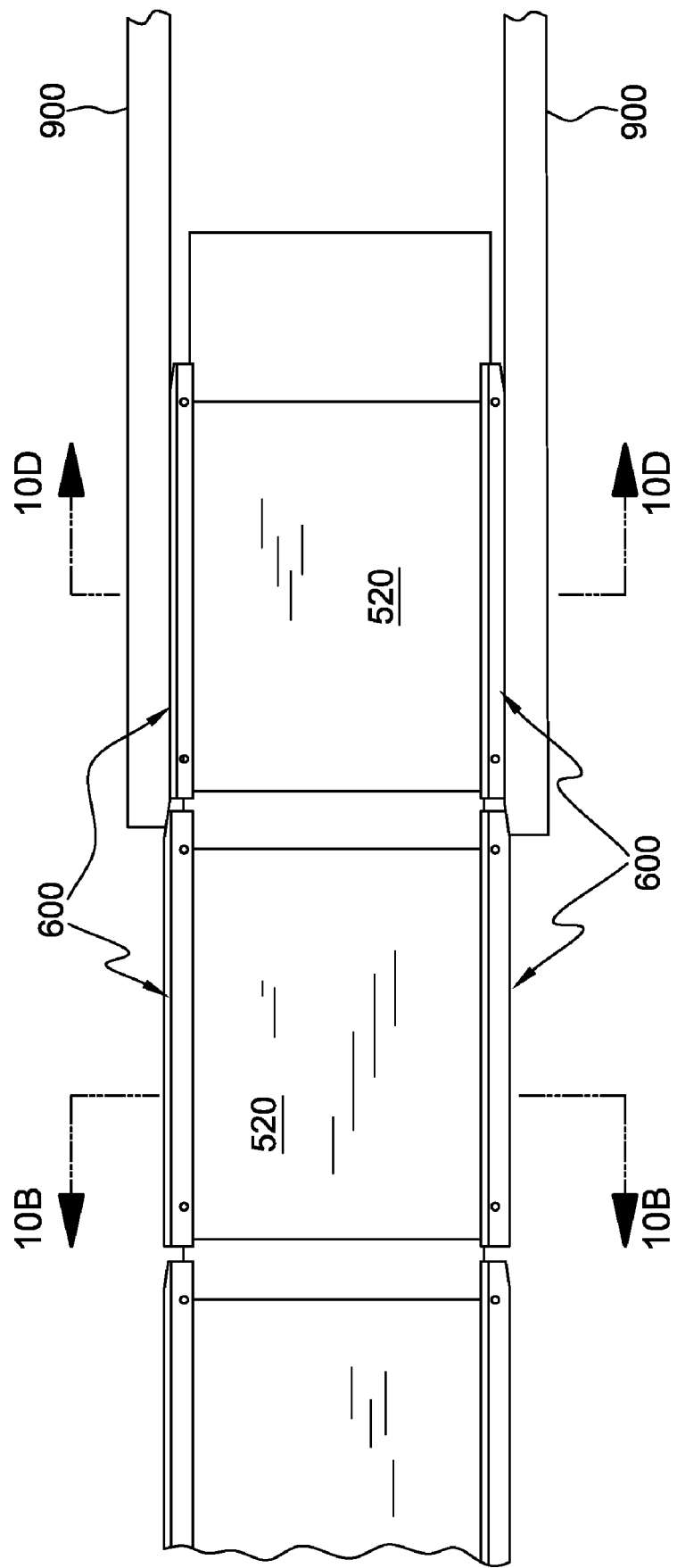
FIG. 10A is an elevational view of the electronics structure, compliant conduction rail assemblies, and thermal transfer plates of FIG. 9, in accordance with an aspect of the present invention.
Figure 10C:
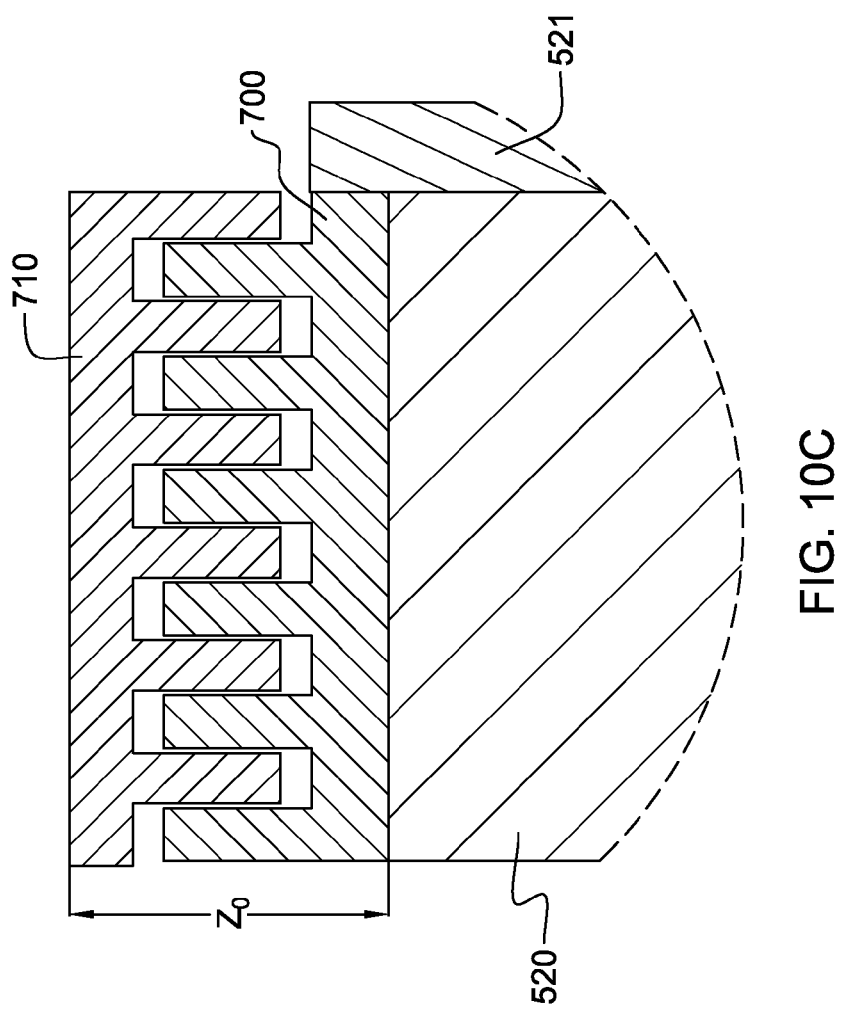
FIG. 10C is a partial enlargement of the electronics structure, compliant conduction rail assemblies, and thermal transfer plates of FIG. 10B, in accordance with an aspect of the present invention.
Figure 10B:
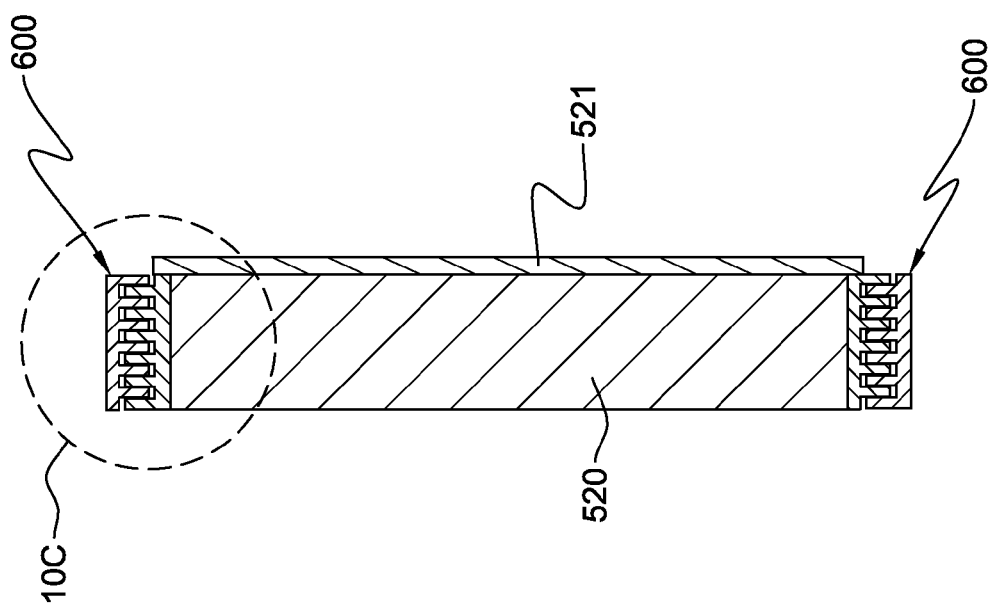
FIG. 10B is a transverse cross-sectional view of the electronics structure, compliant conduction rail assemblies, and thermal transfer plates of FIG. 10A, taken along line 10B-10B thereof, in accordance with an aspect of the present invention.

FIG. 10A illustrates a side elevational view of the structure of FIGS. 9 & 9A, wherein transverse cross-sectional lines 10B-10B and 10D-10D are provided, showing views for FIGS. 10B & 10D, respectively. In FIG. 10B, a transverse cross-sectional illustration of the electronics blade 500 is shown, wherein electronic device 520 is mounted to electronics board 521 and a first compliant conduction rail assembly 600 is mounted to the upper edge of electronic device 520 and a second compliant conduction rail assembly 600 is mounted to the lower edge of electronic device 520. In this view, electronic device 520 at issue has yet to be inserted between the thermal transfer plates of FIG. 10A and the distance between the upper and lower surfaces of each compliant conduction rail assembly is shown in FIG. 10C to be $Z_o$.

FIG. 10D, which is the cross-sectional illustration taken through line 10D-10D in FIG. 10A, depicts the portion of electronics blade 500 inserted between the upper and lower thermal transfer plates 900 of the housing. In this embodiment, electronic device 520 is shown mounted to electronics board 521 with a first compliant conduction rail assembly 600 disposed on an upper edge and a second compliant conduction rail assembly 600 disposed on a lower edge. When the electronics blade is inserted between the thermal transfer plates (i.e., is slidably inserted within the housing), the second thermally conductive rail 710 (see FIG. 10E) of each compliant conduction rail assembly 600 engages the respective thermal transfer plate 900 and is forced by the respective thermal transfer plate towards the first thermally conductive rail 700, with the result being that the distance between the upper and lower surfaces of the compliant conduction rail assembly is reduced to a height Z, as illustrated in FIG. 10E. This results in the electronic device 520 having a good thermal contact to the thermal transfer plate (or liquid-cooled cold plate) within the housing for transfer of heat 1000 from the electronic device to the thermal transfer plate.

Note that in this example, first thermally conductive rail 700 of each compliant conduction rail assembly 600 is mounted to the respective electronic device at the upper and/or lower edge of the disk drive. This can be accomplished mechanically via screws, with a compliant thermal interface grease (or pad) disposed between the first thermally conductive rail and the electronic device, or could be accomplished chemically (or adhesively) using a thermally conductive epoxy, or via metallurgical bonding of the first thermally conductive rail to the electronic device. Note also, although shown as being disposed above and below the upper and lower edges of each electronic device, the compliant conduction rail assemblies disclosed herein could be selectively disposed only above the electronic devices, or only below the electronic devices, or alternatively, above and below only certain electronic devices on an electronics board (or other structure) being inserted within a housing, as desired, based upon the cooling requirements of each electronic device within the blade or subsystem. Further, note that the vertical disposition of the electronics blade when inserted into the housing is presented by way of example only. The compliant conduction rail assemblies described above are equally applicable to being disposed on vertically-extending surfaces of the blade (or subsystem) for engagement with respective vertically-oriented thermal transfer plates (or liquid-cooled cold plates) within the next level of packaging, that is, within the housing to which the blade or subsystem is to dock.

Figure 11A:
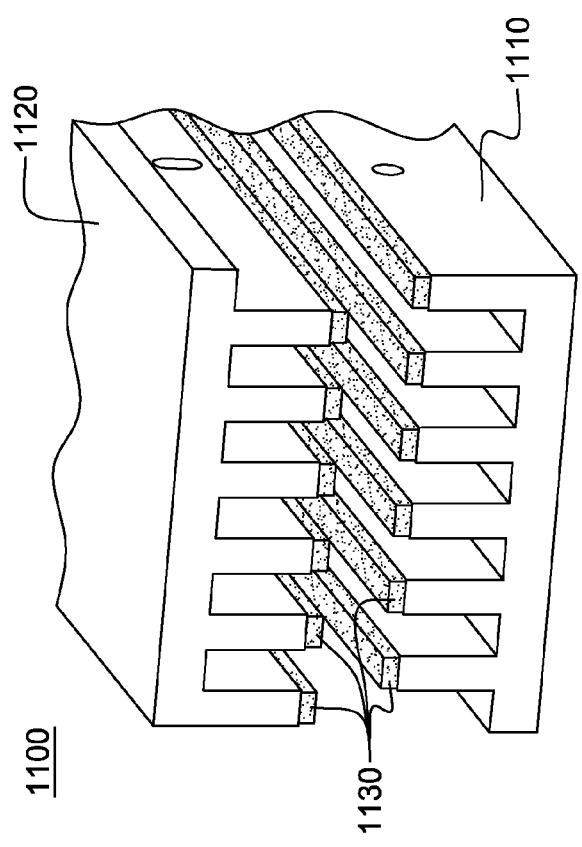
FIG. 11A is a partial perspective view of an alternate embodiment of a compliant conduction rail assembly, in accordance with an aspect of the present invention.
Figure 11B:
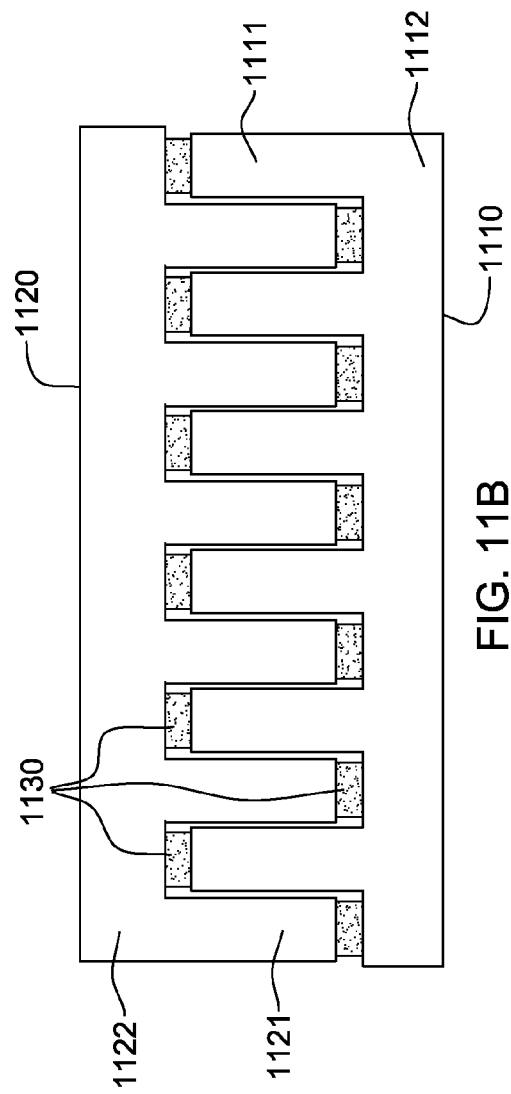
FIG. 11B is an elevational view of the compliant conduction rail assembly embodiment of FIG. 11A, in accordance with an aspect of the present invention.

FIGS. 11A & 11B depict an alternate embodiment of a compliant conduction rail assembly, generally denoted 1100, in accordance with an aspect of the present invention. As illustrated, compliant conduction rail assembly 1100 includes a first thermally conductive rail 1110 configured to mount to a surface of an electronics structure to be inserted into a housing, and a second thermally conductive rail 1120 thermally interfaced to the first thermally conductive rail 1110 to allow for heat transfer between the first thermally conductive rail and the second thermally conductive rail. The biasing mechanism in this example is provided by compressive strips 1130 mounted to the ends of the plurality of thermally conductive fins 1111 extending from a thermally conductive base 1112 of first thermally conductive rail 1110, and the ends of a plurality of thermally conductive fins 1121 extending from a thermally conductive base 1122 of second thermally conductive rail 1120. As with the above example, the pluralities of thermally conductive fins 1111, 1121, are sized and configured to interdigitate when the first thermally conductive rail and second thermally conductive rail are assembled, as illustrated in the elevational view of FIG. 11B.

Note that compressive material 1130 could be affixed to less than all of the ends of the pluralities of thermally conductive fins 1111, 1121, or alternatively, could be affixed to only the ends of the plurality of thermally conductive fins of the first thermally conductive rail or only the ends of the plurality of the thermally conductive fins of the second thermally conductive rail. In one embodiment, the compressive material comprises compressive strips made of rubber or a commonly known thermal interface material, such as a thermal interface pad or gap material. By way of example, reference the materials marketed by the Berquist Company, of Chanhassen, Minn., USA. The compressive material provides the vertical compliance and compressive loading that the springs provide in the biasing mechanism described above in connection with the embodiment of FIGS. 7A & 7B. Further, the compressive material is thermally conductive and thus improves the heat transfer characteristics of the rail assembly by not having to remove rail material to accommodate the springs, and by providing a conduction path from the ends of the fins to the opposing thermally conductive base. This is especially true in the case of a thermal interface material being employed as the compressive material.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims

What is claimed is:

1. A compliant conduction rail assembly for facilitating cooling of an electronics structure, the compliant conduction rail assembly comprising:
    a first thermally conductive rail to mount to a surface of the electronics structure;
    a second thermally conductive rail thermally conductively interfaced to the first thermally conductive rail to allow for heat transfer between the first thermally conductive rail and the second thermally conductive rail;
    a biasing mechanism biasing the second thermally conductive rail away from the first thermally conductive rail; and
    wherein the first thermally conductive rail, second thermally conductive rail and biasing mechanism are configured for slidable insertion thereof with the electronics structure into a housing containing a thermal transfer plate, and wherein with insertion of the electronics structure into the housing, the second thermally conductive rail engages the thermal transfer plate, and is forced by the biasing mechanism into thermal contact with the thermal transfer plate, and is forced by the thermal transfer plate towards the first thermally conductive rail, wherein the compliant conduction rail assembly provides a compliant thermal interface between the electronics structure and the thermal transfer plate within the housing.

2. The compliant conduction rail assembly of claim 1, wherein the first thermally conductive rail comprises a first plurality of thermally conductive fins, and the second thermally conductive rail comprises a second plurality of thermally conductive fins, and wherein the first plurality of thermally conductive fins and second plurality of thermally conductive fins are interdigitated, and wherein once the electronics structure is slidably inserted into the housing, heat is transferred from the electronics structure through the first plurality of thermally conductive fins of the first thermally conductive rail to the second plurality of thermally conductive fins of the second thermally conductive rail, and thereafter to the thermal transfer plate of the housing.

3. The compliant conduction rail assembly of claim 2, wherein the first plurality of thermally conductive fins comprises a first plurality of rectangular-shaped fins extending perpendicular from a base of the first thermally conductive rail, and the second plurality of thermally conductive fins comprises a second plurality of rectangular-shaped fins extending perpendicular from a base of the second thermally conductive rail, and wherein the biasing mechanism biases ends of the first plurality of rectangular-shaped fins away from the base of the second thermally conductive rail and biases ends of the second plurality of rectangular-shaped fins away from the base of the first thermally conductive rail.

4. The compliant conduction rail assembly of claim 2, further comprising a thermally conductive material disposed within a gap between the first thermally conductive rail and the second thermally conductive rail, the gap being defined at least partially between the interdigitated first plurality of thermally conductive fins and second plurality of thermally conductive fins.

5. The compliant conduction rail assembly of claim 2, wherein the biasing mechanism comprises a compressive material disposed between the first thermally conductive rail and the second thermally conductive rail, wherein the compressive material is disposed, at least in part, between at least one of an end of at least one thermally conductive fin of the first plurality of thermally conductive fins and a base of the second thermally conductive rail, or an end of at least one thermally conductive fin of the second plurality of thermally conductive fins and a base of the first thermally conductive rail.

6. The compliant conduction rail assembly of claim 1, further comprising retention pins disposed within channels formed within overlapping portions of the first thermally conductive rail and the second thermally conductive rail, the retention pins and channels allowing a defined amount of travel of the second thermally conductive rail relative to the first thermally conductive rail.

7. The compliant conduction rail assembly of claim 1, wherein the second thermally conductive rail comprises a chamfered leading edge in a direction that the electronics structure is slidably inserted into the housing.

8. The compliant conduction rail assembly of claim 1, wherein the electronics structure is an electronics blade and the first thermally conductive rail mounts to an edge of the electronics blade.

9. The compliant conduction rail assembly of claim 8, wherein the electronics blade comprises multiple electronic devices mounted to an electronics board, and wherein the first thermally conductive rail mounts to an edge of one electronic device of the multiple electronic devices mounted to the electronics board.

10. The compliant conduction rail assembly of claim 1, wherein the thermal transfer plate is a liquid-cooled cold plate mounted within the housing, and wherein the second thermally conductive rail comprises a contact surface which engages an opposing contact surface of the liquid-cooled cold plate upon insertion of the electronics structure into the housing, the contact surface of the second thermally conductive rail having a smaller surface area than a surface area of the opposing contact surface of the liquid-cooled cold plate mounted within the housing.

11. A liquid-cooled electronics chassis comprising:
    a housing containing at least one liquid-cooled cold plate;
    a plurality of electronics structures, wherein the housing and the electronics structures are configured for operative docking of the electronics structures within the housing, and wherein an electronics structure of the plurality of electronics structures comprises at least one compliant conduction rail assembly, the at least one compliant conduction rail assembly comprising:
        a first thermally conductive rail mounted to a surface of the electronics structure;
        a second thermally conductive rail thermally conductively interfaced to the first thermally conductive rail to allow for heat transfer between the first thermally conductive rail and the second thermally conductive rail;

a biasing mechanism biasing the second thermally conductive rail away from the first thermally conductive rail; and wherein with insertion of the electronics structure into the housing, the second thermally conductive rail engages the liquid-cooled cold plate and is forced by the biasing mechanism into thermal contact with the liquid-cooled cold plate, and is forced by the liquid-cooled cold plate towards the first thermally conductive rail, wherein the compliant conduction rail assembly provides a compliant thermal interface between the electronics structure and the liquid-cooled cold plate when the electronics structure is within the housing.

12. The liquid-cooled electronics chassis of claim 11, wherein the electronics structure is an electronics blade and the first thermally conductive rail mounts to an edge surface of the electronics blade.

13. The liquid-cooled electronics chassis of claim 12, wherein the electronics blade comprises multiple electronic devices mounted to an electronics board, and wherein the first thermally conductive rail mounts to an edge surface of at least one electronic device of the multiple electronic devices mounted to the electronics board.

14. The liquid-cooled electronics chassis of claim 13, wherein the electronics structure comprises multiple compliant conduction rail assemblies, each compliant conduction rail assembly being mounted to a different electronic device edge surface of the multiple electronic devices mounted to the electronics board.

15. The liquid-cooled electronics chassis of claim 11, wherein the housing contains multiple liquid-cooled cold plates, a first liquid-cooled cold plate being disposed in opposing relation to a first edge of the electronics structure and a second liquid-cooled cold plate being disposed in opposing relation to a second edge of the electronics structure when the electronics structure is operatively inserted within the housing, and wherein the electronics structure comprises multiple compliant conduction rail assemblies, a first compliant conduction rail assembly being mounted to the first edge of the electronics structure and a second compliant conduction rail assembly being mounted to the second edge of the electronics structure.

16. The liquid-cooled electronics chassis of claim 11, wherein the first thermally conductive rail comprises a first plurality of thermally conductive fins, and the second thermally conductive rail comprises a second plurality of thermally conductive fins, and wherein the first plurality of thermally conductive fins and the second plurality of thermally conductive fins are interdigitated, and wherein once the electronics structure is operationally inserted into the housing, thermal energy is transferred from the electronics structure through the first plurality of thermally conductive fins of the first thermally conductive rail to the second plurality of thermally conductive fins of the second thermally conductive rail, and thereafter to the liquid-cooled cold plate of the housing.

17. The liquid-cooled electronics chassis of claim 16, wherein the first plurality of thermally conductive fins comprises a first plurality of rectangular-shaped fins extending perpendicular from a base of the first thermally conductive rail, and the second plurality of thermally conductive fins comprises a second plurality of rectangular-shaped fins extending perpendicular from a base of the second thermally conductive rail, and wherein the biasing mechanism biases ends of the first plurality of rectangular-shaped fins away from the base of the second thermally conductive rail and biases ends of the second plurality of rectangular-shaped fins away from the base of the first thermally conductive rail.

18. The liquid-cooled electronics chassis of claim 11, wherein the least one compliant conduction rail assembly further comprises retention pins disposed within channels formed within overlapping portions of the first thermally conductive rail and the second thermally conductive rail, the retention pins and channels allowing a defined amount of travel of the second thermally conductive rail relative to the first thermally conductive rail.

19. A method of facilitating cooling of an electronics structure slidably insertable into a housing, the method comprising:

providing a liquid-cooled cold plate within the housing;

mounting a compliant conduction rail assembly to the electronics structure, the compliant conduction rail assembly comprising:

a first thermally conductive rail mounted to a surface of the electronics structure;

a second thermally conductive rail thermally conductively interfaced to the first thermally conductive rail to allow for heat transfer between the first thermally conductive rail and the second thermally conductive rail;

a biasing mechanism biasing the second thermally conductive rail away from the first thermally conductive rail;

wherein the first thermally conductive rail, second thermally conductive rail and biasing mechanism are configured for slidable insertion thereof with the electronics structure into the housing containing the liquid-cooled cold plate; and wherein with insertion of the electronics structure into the housing, the second thermally conductive rail engages the liquid-cooled cold plate and is forced by the biasing mechanism into thermal contact with the liquid-cooled cold plate, and is forced by the liquid-cooled cold plate toward the first thermally conductive rail, and wherein the compliant conduction rail assembly provides a compliant thermal interface between the electronics structure and the liquid-cooled cold plate within the housing.

20. The method of claim 19, wherein the mounting comprises mounting the conduction rail assembly to an edge of the electronics structure, and wherein the first thermally conductive rail comprises a first plurality of thermally conductive fins and the second thermally conductive rail comprises a second plurality of thermally conductive fins, and wherein the first plurality of thermally conductive fins and second plurality of thermally conductive fins are interdigitated, and wherein once the electronics structure is inserted into the housing, heat is transferred from the electronics structure through the first plurality of thermally conductive fins of the first thermally conductive rail to the second plurality of thermally conductive fins of the second thermally conductive rail, and thereafter, to the liquid-cooled cold plate contained within the housing.

* * * * *